(12) United States Patent
Agarwal et al.

(10) Patent No.: US 7,298,193 B2
(45) Date of Patent: Nov. 20, 2007

(54) METHODS AND ARRANGEMENTS TO ADJUST A DUTY CYCLE

(75) Inventors: Kanak B. Agarwal, Austin, TX (US); Robert K. Montoye, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/377,507

(22) Filed: Mar. 16, 2006

(65) Prior Publication Data

US 2007/0216457 A1 Sep. 20, 2007

(51) Int. Cl.
*H03K 3/017* (2006.01)
*H03K 5/04* (2006.01)
*H03K 7/08* (2006.01)

(52) U.S. Cl. .................. 327/175; 327/172; 327/173; 327/174

(58) Field of Classification Search ........ 327/172–176, 327/31, 35–38
See application file for complete search history.

(56) References Cited

U.S. PATENT DOCUMENTS

| | | | | |
|---|---|---|---|---|
| 6,040,726 | A | * | 3/2000 | Martin ...................... 327/715 |
| 6,940,328 | B2 | * | 9/2005 | Lin ............................ 327/175 |
| 7,019,574 | B2 | * | 3/2006 | Schrodinger ............... 327/175 |
| 2005/0007168 | A1 | * | 1/2005 | Park et al. .................. 327/175 |

OTHER PUBLICATIONS

Jang, Y.C., et al., "CMOS Digital Duty Cycle Correction Circuit for Multi-Phase Clock," Electronics Letters, Sep. 2004, pp. 1383-1384.

Wang, Yi-Ming, et al., "An All-Digital 50% Duty-Cycle Corrector," ISCAS, vol. 2, 2004, pp. II-925-928.

Tajalli, A., et al., "A Duty Cycle Control Circuit for High Speed Applications," ISCAS, vol. 1, 2004, pp. I-781-784.

Cheng, Kuo-Hsing, et al., "A Phase-Locked Pulse Width Control loop with Programmable Duty Cycle," Advanced System Integrated Circuits 2004, Proc. of 2004 IEEE Asia-Pacific, pp. 84-87.

Young, I. A., et al., A PLL Clock Generator with 5 to 110 MHz of Lock Range for Microprocessors, IEEE JSSC., vol. 27, No. 11, Nov. 1992, pp. 1599-1607.

Karthikeyan, S., "Clock Duty Cycle Adjuster Circiut for Switched Capacitor Circuits," Electronics Letters, vol. 38, No. 18, Aug. 29, 2002, pp. 1008-1009.

Nakamura, K., et al., "A CMOS 50% Duty Cycle Repeater Using Complementary Phase Blending," 2000 Symposium on VLSI Circuits Digest of Tech. Papers, pp. 48-49.

(Continued)

*Primary Examiner*—Linh My Nguyen
*Assistant Examiner*—Patrick O'Neill
(74) *Attorney, Agent, or Firm*—Casimer K. Salys; Scubert Osterrieder & Nickelson PLLC

(57) ABSTRACT

Embodiments may include a duty cycle controller to adjust the duty cycle of the clock signal based upon a delay signal and an input clock signal. A duty cycle detector may determine signals with frequencies based upon the duty cycle of the output signal and a correction module may compare the frequencies of the detector signals to generate the delay signal. In some embodiments, once the duty cycle of the output clock signal reaches the desired duty cycle such as fifty percent, the correction module may be turned off.

20 Claims, 5 Drawing Sheets

OTHER PUBLICATIONS

Ogawa, T., et al., "50% Duty-Cycle Correction Circuit for PLL Output," IEEE ISCAS, May 26-29, 2002, pp. IV-21-24.

Chow, Hwang-Cherng, "Duty Cycle Control Circuit and Applications to Frequency Dividers," Proc. of ICECS Sep. 1999, pp. 1619-1622.

Simon, Tam, et al., "Clock Generation and Distribution for the First IA-64 Microprocessor," IEEE JSSC., vol. 35, No. 11, Nov. 2000, pp. 1545-1552.

* cited by examiner

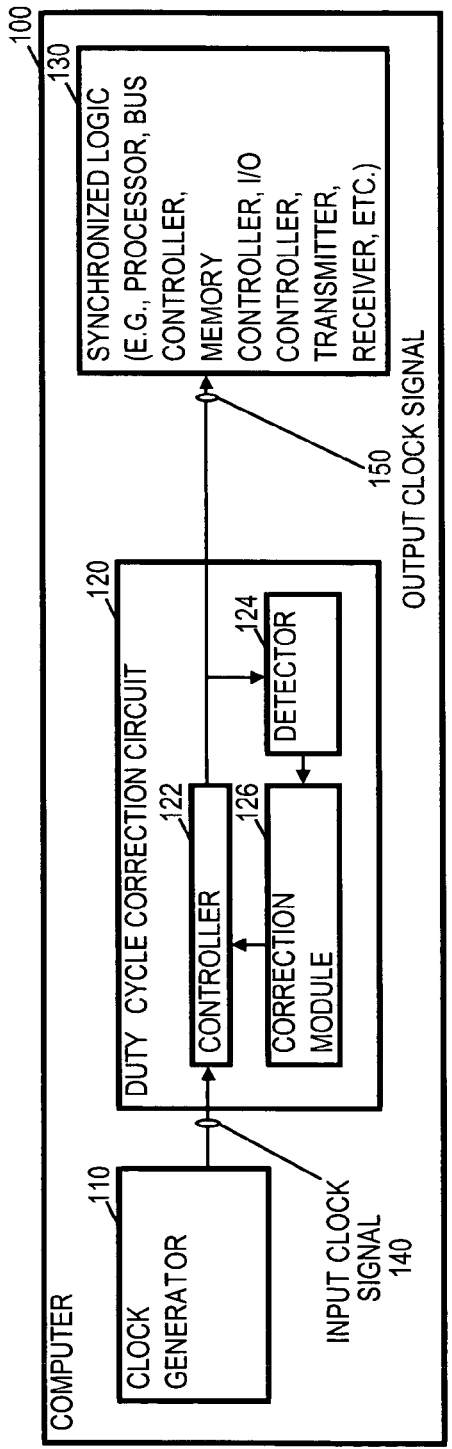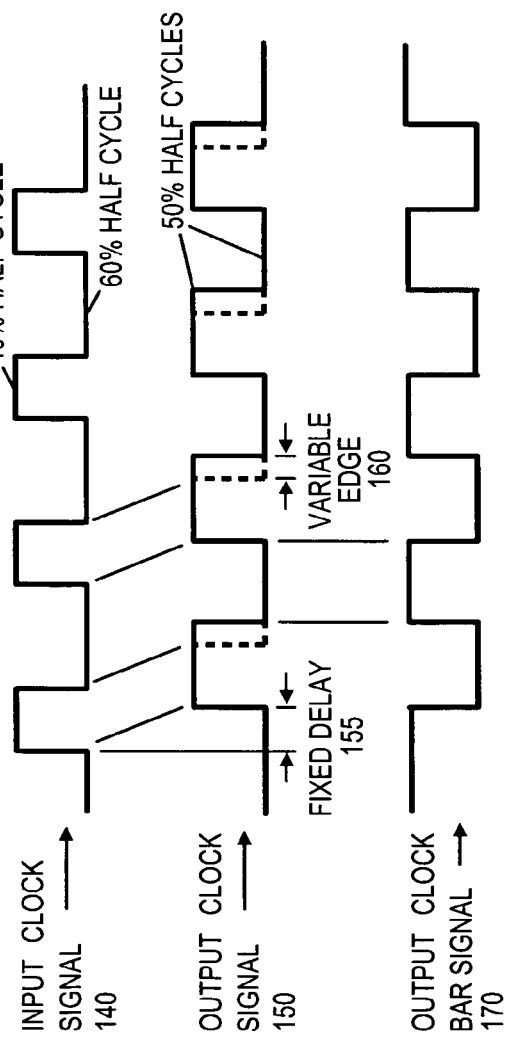
FIG 1A
FIG 1B

METHODS AND ARRANGEMENTS TO ADJUST A DUTY CYCLE

FIELD OF INVENTION

The present invention is in the field of clock signals. More particularly, the present invention relates to methods and arrangements to adjust a duty cycle of a clock signal to, e.g., a 50% duty cycle.

BACKGROUND

Clock signals may be used in electronic circuits to provide timing information. An important aspect of a clock signal in many applications is the clock duty cycle, which may be defined as the ratio of the time the clock pulse is at a high level to the clock period. For example, a clock signal that is high for forty percent of a clock cycle and low for sixty percent of the clock cycle has forty percent duty cycle.

Various circuits may be designed to handle different duty cycles and duty cycles with relatively significant margins of error. However, a fifty percent duty cycle offers advantages in many applications. For instance, a fifty percent duty cycle enables a half-rate (double-edge) clocking system. A half-rate clocking system advantageously eases circuit design constraints compared to those of a full-rate (single-edged) clocking system because it effectively doubles the clock rate without having to double the corresponding VCO frequency. In contrast, when a clock signal has a duty cycle other than fifty percent, the time interval between the rising and falling edges differ from the time interval between the falling and rising edges. Thus, only one transition edge per cycle can be utilized as a valid reference point.

In high-speed applications, for example, such as an analogue-to-digital converter (ADC) and a double-data-rate (DDR) SDRAM, the timings of the rising and falling edges of the clock signal are critical. High-speed circuits utilize each half-cycle to perform an operation. Domino logic, for instance, utilizes a first half cycle to precharge the domino node and the second half cycle to evaluate associated logic. As a result, deviations from a fifty percent duty cycle reduce the amount of time available to perform operations during one of the half-cycles.

Unfortunately, whether the duty cycle is fifty percent or some other percentage, the duty cycle may become distorted or degraded while distributing the clock signal to various circuits of a system such as a computer. For example, mismatches between pull-up and pull-down circuits of clock drivers often skew the clock signal. Furthermore, many other sources of signal distortion or degradation commonly affect the duty cycle such as parameter shifts during semiconductor processing, dimensional variations of printed circuit boards, mismatched line and/or input impedances, environmental conditions, and other common sources.

One solution, at least in terms of the fifty percent duty cycle, is to generate a clock signal with twice the frequency and divide the clock signal. However, generation of a clock signal with twice the desired frequency is difficult and expensive for high performance designs. Furthermore, generation of a clock signal with twice the desired frequency involves high power consumption.

Other solutions involve integration of a duty cycle correction (DCC) circuit. Conventional DCC circuits are based upon the analogue method in which the difference of the duty cycle from fifty percent is averaged over time and is stored as a voltage level in a capacitor. However, the delay between rising and falling edges cannot be maintained at a constant value so the phase information for the clock signal is lost.

More recent innovations in DCC circuits rely on matching devices or external references to monitor the duty cycle of the clock signal. However, use of matching devices such as matched integrators or an external reference is problematic, especially considering that many of the sources of error for the duty cycle relate to errors in the design and/or manufacture of circuits.

SUMMARY OF THE INVENTION

The problems identified above are in large part addressed by methods and arrangements. One embodiment provides an apparatus. The apparatus may comprise a duty cycle controller to adjust a delay between rising and falling edges of an input clock signal based upon a delay signal, to generate an output clock signal. The apparatus may also comprise a duty cycle detector to generate detector signals via at least one oscillator based upon the output clock signal and an inverted output clock signal. Frequency responses of the at least one oscillator to high states of the clock signals differ from frequency responses of the at least one oscillator to low states of the clock signals. The apparatus may further comprise a correction module to generate the delay signal based upon a difference between frequencies of the detector signals.

Another embodiment provides a system. The system may comprise a clock generator to generate a first clock signal and a duty cycle correction circuit. The duty cycle correction circuit may adjust a delay between rising and falling edges of the first clock signal based upon a delay signal, to generate an output clock signal. The duty cycle correction circuit may also generate detector signals with frequencies based upon frequency responses of an oscillator to high and low states of the output signal and an inverted output clock signal and generate the delay signal based upon a difference between the frequencies.

A further embodiment provides a method to adjust a duty cycle of an output clock signal. The method may involve generating an output clock signal based upon an input clock signal, wherein a duty cycle of the output clock signal is based upon a delay signal. The method may further involve oscillating with frequencies dependent upon high and low states of the output clock signal to generate a first detector signal and oscillating with frequencies dependent upon high and low states of an inverted output clock signal to generate a second detector signal. The method may then entail comparing averages of the frequencies of the detector signals and generating the delay signal based upon the comparison.

BRIEF DESCRIPTION OF THE DRAWINGS

Advantages of the invention will become apparent upon reading the following detailed description and upon reference to the accompanying drawings in which, like references may indicate similar elements:

FIGS. 1A-B depict an embodiment of a computer comprising a duty cycle correction circuit to adjust the duty cycle of clock signal for synchronized logic and a timing diagram to illustrate the adjustment;

DETAILED DESCRIPTION OF EMBODIMENTS

Figure 2:
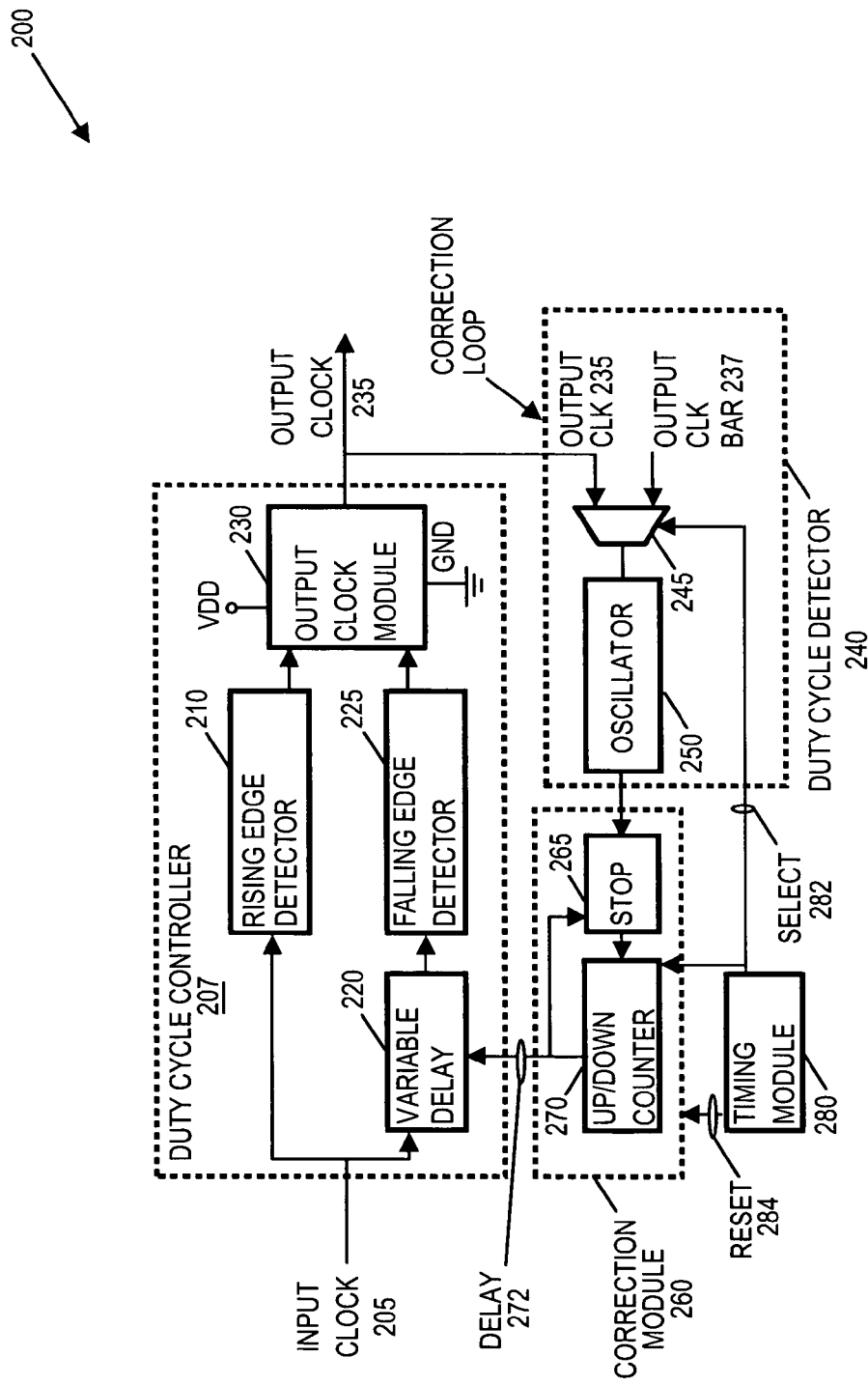
FIG. 2 depicts an embodiment of a circuit to correct a duty cycle of an input clock signal.

The following is a detailed description of embodiments of the invention depicted in the accompanying drawings. The embodiments are in such detail as to clearly communicate the invention. However, the amount of detail offered is not intended to limit the anticipated variations of embodiments, but on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Generally speaking, methods and arrangements to adjust a duty cycle of a clock signal are contemplated. Embodiments may include a duty cycle controller to adjust the duty cycle of the clock signal based upon a delay signal and an input clock signal. A duty cycle detector may determine signals with frequencies based upon the duty cycle of the output signal and a correction module may compare the frequencies of the detector signals to generate the delay signal. In some embodiments, once the duty cycle of the output clock signal reaches the desired duty cycle such as fifty percent, the correction module may be turned off.

While specific embodiments will be described below with reference to particular switch, circuit or logic configurations, those of skill in the art will realize that embodiments of the present invention may advantageously be implemented with other substantially equivalent configurations.

Turning now to the drawings, FIG. 1A depicts an embodiment of a computer 100 including a clock generator 110, a duty cycle correction circuit 120, and synchronized logic 130. Computer 100 may be any integrated circuit system from a handheld device such as a cellular phone or an MP3 player to a super computer or other system that relies on a duty cycle of a clock signal. Alternative embodiments include a card or board such as a motherboard or peripheral component interconnect (PCI) card that rely on a duty cycle of one or more clock signals to execute operations such as transmission of data from one component to another.

Clock generator 110 may generate an input clock signal 140 for the synchronized logic 130. Clock generator 110 may comprise a phase-locked loop circuit, a delay-locked loop circuit, a quartz crystal, or the like. In some embodiments, clock generator 110 may be designed to generate a high frequency clock signal with a duty cycle of, e.g., approximately fifty percent. However, due to, e.g., variations in pull-up and pull-down circuits of clock drivers, the duty cycle of the input clock signal 140 is forty percent as illustrated in the timing diagram of FIG. 1B.

Duty cycle correction circuit 120 receives the input clock signal 140 to generate an output clock signal 150 with a duty cycle closer to, e.g., fifty percent. As illustrated in the timing diagram of FIG. 1B, output clock signal 150 may have a rising edge of the input clock signal 140 but delayed by a fixed delay 155. Duty cycle correction circuit 120 may then adjust the delay of the falling edge, the variable edge 160, of the output clock signal 150 to create a clock signal with a fifty percent duty cycle. In further embodiments, the variable edge 160 may be a rising edge.

In some embodiments, duty cycle correction circuit 120 has a programmable duty cycle objective for the output clock signal 150. For instance, duty cycle correction circuit 120 may receive a program signal from, e.g., synchronized logic 130 or another component of computer 100. The program signal may be indicative of a duty cycle. For example, the program signal may comprise a digital signal indicative of a sixty percent duty cycle. In some embodiments, the digital signal may be a value that represents a difference between frequencies of detector signals associated with a detector 124 such as a differential count of clock cycles for each of the detector signals during a selected time period.

Duty cycle correction circuit 120 may comprise a controller 122, detector 124, and a correction module 126. Controller 122 may receive the input clock signal 140 and generate the output clock signal 150 by adjusting the delay between the rising and falling edges of the output clock signal 150. In many embodiments, generating the output clock signal 150 with a rising edge that has a fixed delay 155 with respect to the rising edge of the input clock signal 140 maintains phase relationship information associated with the input clock signal 140. For instance, the input clock signal 140 may be one phase of a multi-phase clock signal and the phase relationship between each of the phases of the multiphase clock signal may be important for proper operation of the synchronized logic 130. Thus, as long as the fixed delay 155 is substantially the same delay experienced by the rising edges of the each of other phases, synchronized logic 130 may operate properly.

Controller 122 may vary a delay associated with the falling edge of the output clock signal 150 based upon a delay signal received from correction module 126. In particular, the delay signal may be related to the difference between the desired duty cycle and the duty cycle of the output clock signal 150 so controller 122 may vary the delay of the output of the falling edge from the input clock signal 140 to generate the output clock signal 150.

Detector 124 may generate detector signals that have frequencies, or at least average frequencies, that are related to the duty cycle of the output clock signal 150. In many embodiments, the difference between the frequencies of the detector signals quantify the difference between the duty cycle of the output clock signal 150 and the desired duty cycle. In several embodiments, detector 124 comprises a ring oscillator. The ring oscillator is supplied with different magnitudes of current depending upon whether the output clock signal 150 is in a high state or a low state. For instance, in some embodiments, the output clock signal 150 is applied to the gate of a transistor that is weakly turned on when the output clock signal 150 is low and strongly turned on when the output clock signal 150 is high. The frequency of oscillation of the ring oscillator increases with increases in available current, which is proportional to the voltage applied to the gate of, e.g., the output clock signal 150. As a result, the ring oscillator can output a higher frequency signal when the output clock signal 150 is high.

When the duty cycle of the output clock signal 150 is greater than fifty percent, the clock signal remains high for more than fifty percent of the time so the oscillator generates, on average, a higher frequency signal than it would if the duty cycle was fifty percent. Similarly, when the duty cycle of the output clock signal 150 is lower than fifty percent, the clock signal remains low for more than fifty percent of the time so the oscillator generates, on average, a lower frequency signal. Many embodiments quantify the difference in the frequencies between high and low states to determine the difference between the current duty cycle of the output clock signal 150 and the desired duty cycle.

For example, some embodiments compare the frequency of a first detector signal generated by the oscillator in response to the output clock signal 150 against a second detector signal generated in response to an output clock bar signal 170. In such embodiments, there is no difference between the frequencies of the detector signals when the duty cycle of the output clock signal 150 is fifty percent. Furthermore, the average frequencies of the detector signals converge to be substantially the same as the duty cycle of the output clock signal 150 approaches fifty percent. In one embodiment, the output clock signal 150 and the output clock bar signal 170 may be fed to oscillators in parallel.

Note the relationship between the output clock signal 150 and the output clock bar signal 170 is that the clock bar signal is the inverted clock signal. This is the relationship referred to whenever a clock bar signal is discussed herein. Thus, in the present embodiment, the frequencies of the first detector signal and the second detector signal become the same frequency when the output clock signal 150 has exactly a fifty percent duty cycle because the output clock signal 150 and the output clock bar signal 170 are essentially the same.

Correction module 126 may quantify the difference between the frequencies of the detector signals and generate a delay signal based upon the difference. The delay signal is transmitted to controller 122 to adjust the duty cycle of the output signal. In many embodiments, the difference between the frequencies is related to a difference between the duty cycle of the output clock signal 150 and a fifty percent duty cycle. In other embodiments, the difference may be related to another duty cycle or another reference. The desired duty cycle may be programmable or selectable, or may be fixed at, e.g., fifty percent.

In several embodiments, correction module 126 generates a digital value for the delay signal and latches the digital value to a bus between the correction module 126 and the controller 122. The digital value may comprise one or more bits. In some embodiments, once the output signal reaches a desired duty cycle, within a given margin of error, correction module 126 and/or detector 124 may be turned off. Many of such embodiments may comprise logic to turn on correction module 126 and/or detector 124 periodically or in response to an event such as receipt of a reset signal, powering down and up of duty cycle correction circuit 120 and/or clock generator 110, or the like.

Duty cycle correction circuit 120 transmits the output clock signal 150 to synchronized logic 130. Synchronized logic 130 may comprise a circuit or part of a circuit designed to utilize the output clock signal to perform synchronized operations. For instance, synchronized logic 130 may comprise a processor, a bus arbiter and/or other bus controller, a memory controller, an input-output (I/O) controller, a transmitter, a receiver, a transceiver, or the like.

In some embodiments, the proper operation of synchronized logic 130 may depend upon receipt of the output clock signal 150 having a particular duty cycle. For example, some processors include circuitry that depends upon a duty cycle of fifty percent because such processors execute operations during each half cycle of the output clock signal 150. In other embodiments, synchronized logic 130 may operate more efficiently or offer higher performance characteristics when the output clock signal 150 has a particular duty cycle.

FIG. 2 depicts an embodiment of a duty cycle correction circuit 200. Duty cycle correction circuit 200 may adjust a duty cycle of an input clock signal 205 to generate an output clock signal 235 with a desired duty cycle. In the present embodiment, the rising edge of the input clock signal 205 is propagated through a duty cycle controller 207 with no adjustment other than a fixed delay inherent to the circuit of duty cycle controller 207. On the other hand, a variable delay 220 delays the falling edge of input clock signal 205 based upon a delay signal from correction module 260. The variable delay 260 facilitates generation of the output clock signal 235 with the desired duty cycle.

Duty cycle controller 207 comprises a rising edge detector 210, variable delay 220, a falling edge detector 225, and an output clock module 230. Rising edge detector 210 transmits a signal indicative of the rising edge of the input clock signal 205 to output clock module 230 and output clock module 230 responds by pulling the output clock signal 235 high. Variable delay 220 is adapted to add a delay to the input clock signal 205 based upon the delay signal from correction module 260. Then, falling edge detector 225 transmits a signal to output clock module 230 indicative of the falling edge of the delayed input clock signal. Output clock module 230 responds to the signal from falling edge detector 225 by pulling the output clock signal 235 low. In the present embodiment, pulling the output clock signal 235 high refers to pulling the output clock signal 235 toward a circuit voltage, VDD, and pulling the output clock signal 235 low refers to pulling the output clock signal 235 toward a circuit ground, GND. In further embodiments, different voltages, positive and/or negative may be utilized. In other embodiments, an inverted output clock signal may be generated by pulling the output clock signal 235 low in response to rising edges and pulling the output clock signal 235 high in response to falling edges of input clock signal 205.

The output clock signal 235, in addition to being output to another circuit, is fed through a feedback or correction loop. The correction loop comprises a duty cycle detector 240, a correction module 260 and a timing module 280. Duty cycle detector 240 receives the output clock signal 235 and inputs the output clock signal 235 and an output clock bar signal 237 into a multiplexer 245. Multiplexer 245 selects one of the clock signals 235 and 237 to transmit to an oscillator 250 based upon the state of a select signal 282 from timing module 280.

Oscillator 250 generates a detector signal with a frequency related to the duty cycle of the clock signal 235 or 237 received from multiplexer 245. The output of oscillator 250 transmits to correction module 260.

Correction module 260 may compare the frequencies generated by oscillator 250 in response to the output clock signal 235 and the output clock bar signal 237 to generate the delay signal 272. In the present embodiment, correction module 260 counts clock cycles of a first detector signal generated by oscillator 250 to determine a first count and counts cycles of a second detector signal against the first count to determine a differential count. The differential count is then output as delay signal 272 to duty cycle controller 207.

Correction module 260 comprises a stop circuit 265 and an up/down counter 270. Stop current 265 is adapted to block transmission of signals to up/down counter 270 from oscillator 250 once the delay signal 272 is indicative of the desired duty cycle. For instance, the delay signal 272 may comprise an output representative of a zero value when the output clock signal 235 has a duty cycle of fifty percent. In response to the zero value, stop circuit 265 may block transmission of detector signals to up/down counter 270. In some embodiments, stop circuit 265 comprises AND logic to block the detector signals in response to a zero valued delay signal 272.

Up/down counter 270 counts up in response to a first select signal 282 and counts down from the current count in response to a second select signal 282. In the present embodiment, timing module 280 is a separate circuit from correction module 260 and duty cycle detector 240. However, in other embodiments, timing module 280 may be integrated with another circuit.

Timing module 280 may generate the select signal 282 and a reset signal 284. In some embodiments, the select signal 282 may switch between a logical one and a logical zero after a time period T. The time period T may be a predefined period or a programmable time period. The time period T defines the amount of time that cycles are counted for each of the detector signals. The greater the time period T, the greater the resolution of the delay signal 272. The resolution of the delay signal 272 and variable delay 220 may define the accuracy with which duty cycle correction circuit 200 can set the duty cycle of the output clock signal 235.

Timing module 280 may generate the reset signal 284 to reset the count of up/down counter 270 to zero after two periods T to reset the differential counter value. In further embodiments, correction module 260 may be capable of averaging differential counter values over multiple periods to provide second order duty cycle correction. In other embodiments, the reset signal 284 may reset the current count of up/down counter 270 to a value other than zero.

Figure 3:
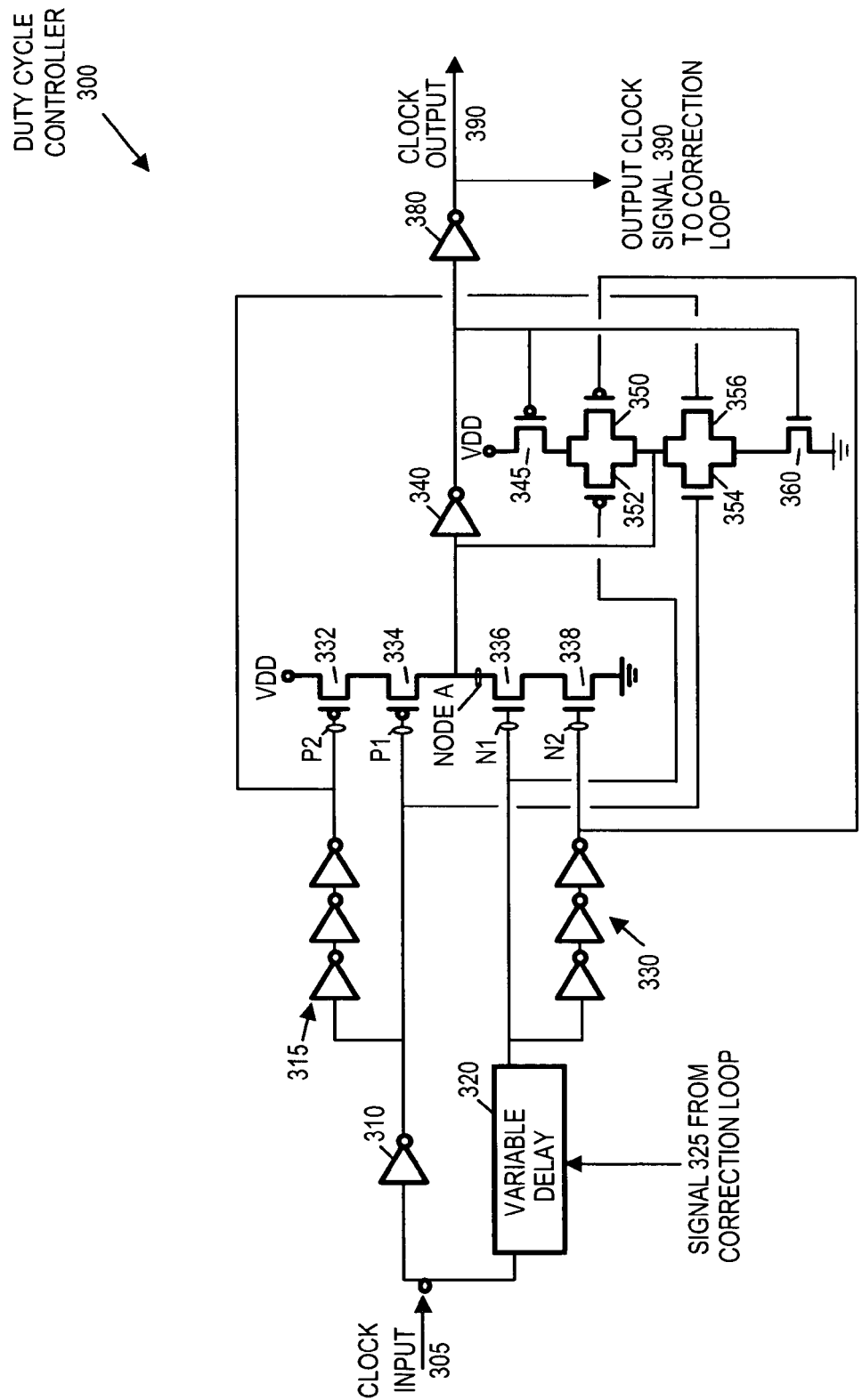
FIG. 3 depicts an embodiment of a duty cycle controller.

FIG. 3 depicts a circuit diagram of an embodiment of a duty cycle controller 300. Duty cycle controller 300 may modify a duty cycle of an input clock signal 305 to create an output clock signal 390. In the present embodiment, duty cycle controller 300 passes the rising edge of the input clock signal 305 through to the output for the output clock signal 390 and inserts a variable delay 320 between a rising and a falling edge of the input clock signal 305 to generate the output clock signal. The duration of variable delay 320 is based upon a signal 325 from a correction loop. Circuit components of duty cycle controller 300 add a fixed delay to both the rising edge and the falling edge as they pass through duty cycle controller 300 toward the output. In other embodiments, duty cycle controller 300 may insert a variable delay between the falling and rising edges of the input clock signal or between both.

Duty cycle controller 300 comprises two paths for the rising edge of each cycle and two paths for the falling edge of each cycle of the input clock signal 305. Both the rising edge paths pass through inverter 310 to generate a first path signal P1. Signal P1 is applied to the gate of PMOS transistor 334 and NMOS transistor 354 after a delay associated with one inverter. In the second path for the rising edge, the P1 signal passes through inverters 315. Inverters 315 add a three-inverter delay to the P1 signal to generate a P2 signal. The P2 signal is applied to the gate of PMOS transistor 332 and NMOS transistor 356.

Assuming node A is initially a low, the rising edge of the input clock signal 305 turns on PMOS transistors 332 and 334 and turns off NMOS transistors 354 and 356 for a duration of three-inverter delays. Signals N1 and N2 are low, turning off NMOS transistors 336 and 338 and turning on PMOS transistors 350 and 352. Node A is pulled up to VDD. Inverter 340 inverts the voltage VDD on node A to low, turning on PMOS transistor 345. Thus, with node A is pulled high to VDD via PMOS transistors 332, 334, 350 and 352.

After the three-inverter delay, node A is detached from the power source VDD. After the variable delay 320, N1 and N2 signals turn on NMOS transistors 336 and 338 and turn off PMOS transistors 350 and 352 for three-inverter delays via inverters 330. Turning on NMOS transistors 336 and 338 pulls node A low. Inverter 340 inverts the low voltage on node A to VDD, which turns transistor 345 off and turns transistor 360 on. P1 and P2 signals are both high so NMOS transistors 354 and 356 are turned on and pulling node A low. Inverter 380 inverts the signal from inverter 340 so the output clock signal remains high while node A remains high and remains low while node A remains low.

Figure 4:
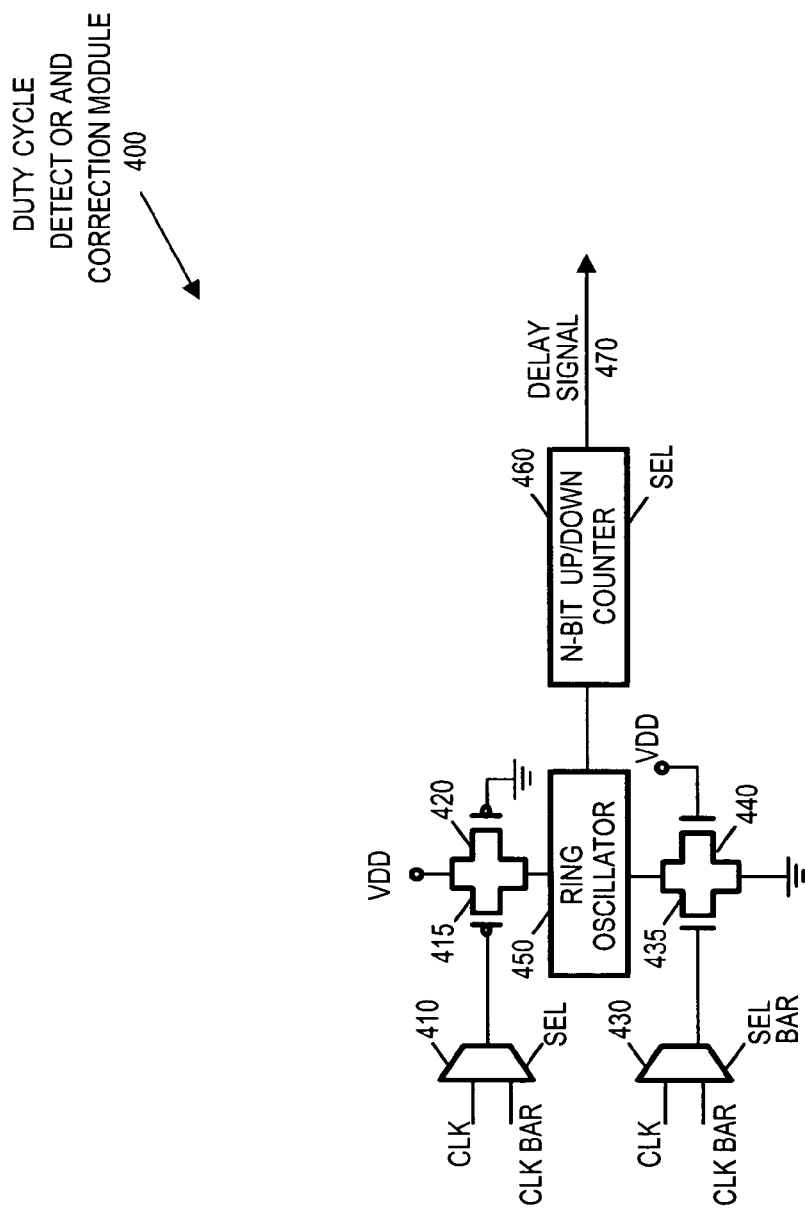
FIG. 4 depicts an embodiment of a duty cycle detector with a timing module.

FIG. 4 depicts an embodiment of a duty cycle detector and correction module 400. Duty cycle detector and correction module 400 receives four signals, CLK, CLK Bar, SEL, and SEL bar. Based upon these four signals, duty cycle detector and correction module 400 generates a delay signal 470 indicative of the duty cycle of signal CLK. Duty cycle detector and correction module 400 comprises multiplexers 410 and 430, PMOS transistors 415 and 420, a ring oscillator 450, NMOS transistors 435 and 440, and an N-bit up/down counter 460.

Multiplexers 410 and 430 receive the select signals, SEL and SEL Bar, respectively, to select between signals CLK and CLK Bar. Thus, when multiplexer 410 selects CLK, multiplexer 430 selects CLK Bar, and, when multiplexer 410 selects CLK Bar, multiplexer 430 selects CLK. In many embodiments, the select signals SEL and SEL Bar maintain the same value such as a logic zero or a logical one for a time period T and then switch values for a subsequent time period T.

PMOS transistors 415 conducts a current in response to a low clock signal and turns off during a high clock signal from multiplexer 410 while PMOS transistor 420 conducts a current regardless of whether the signal from multiplexer 410 is low or high. Similarly, NMOS transistor 435 conducts a current in response to a high clock signal and turns off during a low clock signal from multiplexer 430. And transistor 440 conducts a current regardless of whether the signal from multiplexer 430 is low or high.

To illustrate, assume the select signal SEL is low so the select signal SEL Bar is high. In response, multiplexer 410 outputs the signal CLK Bar and multiplexer 430 outputs the signal CLK. While CLK is high, CLK Bar is low so the four transistors 415, 420, 435, and 440 conduct a strong current. When CLK goes low, CLK Bar is high so transistors 415 and 430 turn off. Transistors 420 and 440 conduct a relatively weaker current. The relatively weaker current produces a relatively slower frequency signal via ring oscillator 450. Thus, when CLK has a duty cycle that is greater than fifty percent, CLK remains high more than fifty percent of the time period T and the number of cycles received by N-bit up/down counter 460 is higher than if the duty cycle of CLK is lower than fifty percent.

Then, when the select signal switches from low to high, multiplexer 410 selects the signal CLK and multiplexer 430 selects the signal CLK Bar. Thus, larger currents are conducted while CLK is low and lower currents are conducted while CLK is high. Ring oscillator 450 produces a higher frequency signal while CLK is low and a relatively lower frequency while CLK is high. Thus, when CLK has a duty cycle that is greater than fifty percent, CLK remains low more than fifty percent of the time period T and the number of cycles received by N-bit up/down counter 460 is lower than if the duty cycle of CLK is lower than fifty percent.

In some embodiments, the differences between the frequencies produced by ring oscillator 450 are enhanced by creating strong transistors for transistors 415 and 435 and/or creating weak transistors for transistors 420 and 440. Strong transistors are capable of conducting higher currents than weak transistors so the spread between the frequencies of the detector signals created by ring oscillator 450 will be greater. In many embodiments, the width of the channels can be increased to create the stronger transistors and/or the widths of the weaker devices can be shortened. In other embodiments, long channel devices may be created by connecting more than one transistors together in series.

N-bit up/down counter 460 may count up during a first time period T and count down during a subsequent time period T. The select signal SEL may switch counter 460 between counting up and counting down. The resulting n-bit value after the first and second time periods may then be latched to the output of counter 460 as delay signal 470. In some embodiments, the number of bits utilized of the N-bit up/down counter 460 may be programmable.

Figure 5:
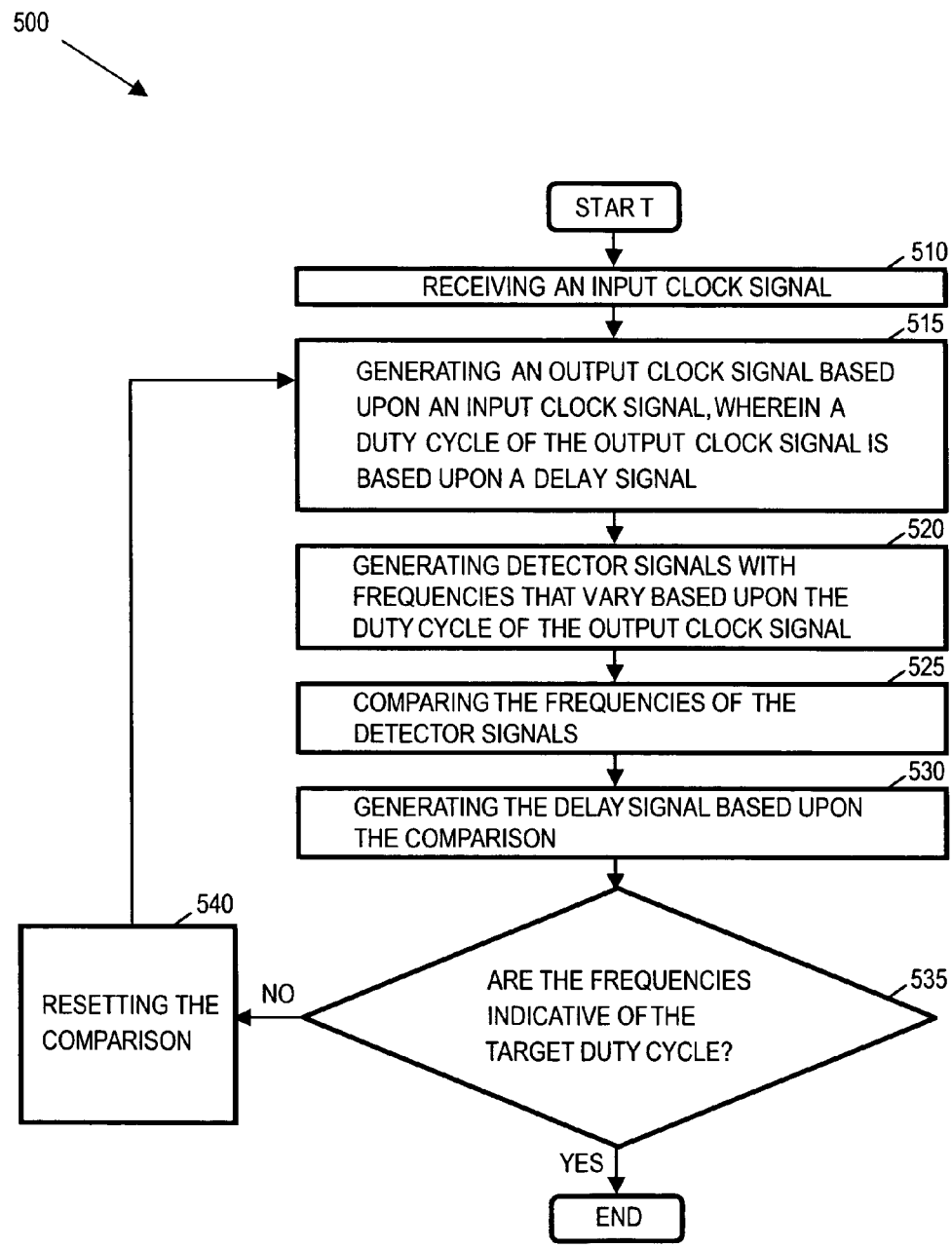
FIG. 5 depicts a flowchart to adjust a duty cycle of an output clock signal based upon a delay signal and an input clock signal.

Referring now to FIG. 5, there is shown a flowchart 500 of an embodiment to adjust a duty cycle of an input clock signal. Flowchart 500 begins with receiving the input clock signal (element 510). For example, a clock generator circuit may generate the input clock signal and transmits the input clock signal to a duty cycle correction circuit to adjust the duty cycle so the clock signal may be used for high speed clocking operations.

Given the input clock signal, a duty cycle controller may generate an output clock signal based upon the input clock signal, wherein a duty cycle of the output clock signal is based upon a delay signal (element 515). In some embodiments, when the input clock signal is first received, no valid delay signal may be generated so the delay signal may be initialized to indicate a minimal delay. For example, the delay signal be interpreted by the duty cycle controller to insert a delay between rising and falling edges of the input clock signal, i.e., between a rising edge and a subsequent falling edge and/or a falling edge and a subsequent rising edge. The amount of the delay may be related to a magnitude indicated by the delay signal.

The output clock signal may be fed through a correction loop to calculate the delay signal. In particular, the output clock signal may be transmitted to a duty cycle detector to generate signals with frequencies that vary based upon the duty cycle of the output clock signal (element 520). For example, the duty cycle detector may vary the current available to an oscillator circuit with the output clock signal to generate detector signals that have a faster frequency associated with high clock signals than the frequency associated with low clock signals.

In such embodiments, the resulting count of cycles or the average frequency of the detector signals may be compared with a reference number of cycles or average frequency (element 525). In many embodiments, the reference number of cycles or average frequency may be the number of cycles or frequency resulting from inputting the output clock bar signal to the oscillator circuit. In still further embodiments, the output clock signal and the output clock bar signal are both input into the oscillator circuit to increase the difference between the high frequency oscillations and the low frequency oscillations in the detector signals.

A correction module may generate the delay signal based upon the comparison (element 530). For instance, the comparison may generate a differential count related to the duty cycle of the output clock signal. The differential count may be latched to an output of the correction module to generate the delay signal.

Once the delay signal is generated, the comparison may be reset and a new output signal may be generated based upon the new delay signal (element 540) if the comparison indicates that the duty cycle of the output clock signal does not match the desired duty cycle. On the other hand, if the frequencies of the detector signals indicate that the duty cycle of the output clock signal is sufficiently close to the desired duty cycle, e.g., within a margin of error, the correction loop may power down or at least stop generating delay signals (element 535).

Another embodiment is implemented as a program product for implementing a design simulation to simulate one or more of the methods and arrangements described with reference to FIGS. 1-5. The program(s) of the program product defines functions of the embodiments (including the methods described herein) and can be contained on a variety of data and/or signal-bearing media. Illustrative data and/or signal-bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); and (iii) information conveyed to a computer by a communications medium, such as through a computer or telephone network, including wireless communications. The latter embodiment specifically includes information downloaded from the Internet and other networks. Such data and/or signal-bearing media, when carrying computer-readable instructions that direct the functions, represent embodiments.

In general, the routines executed to implement the embodiments may be part of an operating system or a specific application, component, program, cell, object, or sequence of instructions. The computer program of the present invention typically is comprised of a multitude of instructions that will be translated by a computer into a machine-readable format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus embodiments should not be limited to use solely in any specific application identified and/or implied by such nomenclature.

It will be apparent to those skilled in the art having the benefit of this disclosure that the present invention contemplates methods and arrangements to adjust a duty cycle of a clock signal. It is understood that the form of the invention shown and described in the detailed description and the drawings are to be taken merely as examples. It is intended that the following claims be interpreted broadly to embrace all the variations of the example embodiments disclosed.

Although the present invention and some of its advantages have been described in detail for some embodiments, it should be understood that various changes, substitutions and alterations can be made herein without departing from the spirit and scope of the invention as defined by the appended claims. Although an embodiment of the invention may achieve multiple objectives, not every embodiment falling within the scope of the attached claims will achieve every objective. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus comprising:
    a duty cycle controller to adjust a delay between rising and falling edges of an input clock signal based upon a delay signal, to generate an output clock signal;
    a duty cycle detector to generate detector signals via at least one oscillator based upon the output clock signal and an inverted output clock signal, wherein frequency responses of the at least one oscillator to high states of the clock signals differ from frequency responses of the at least one oscillator to low states of the clock signals, wherein the duty cycle detector comprises one oscillator to generate a first detector signal of the detector signals based upon the high states and the low states of the output clock signal and a second detector signal of the detector signals based upon the high states and the low states of the inverted output clock signal; and
    a correction module to generate the delay signal based upon a difference between frequencies of the detector signals.

2. The apparatus of claim 1, wherein the at least one oscillator comprises a ring oscillator.

3. The apparatus of claim 1, wherein the duty cycle detector comprises a multiplexer to switch an input of the oscillator between the output clock signal and the inverted output clock signal after a time period.

4. The apparatus of claim 3, wherein the duty cycle detector comprises a timing module to determine the time period.

5. The apparatus of claim 1, wherein the duty cycle detector is adapted to generate at least two signals with substantially equivalent frequencies when the duty cycle of the output clock is fifty percent.

6. The apparatus of claim 1, wherein the correction module comprises a counter to determine a differential count dependent upon the difference between the frequencies of the detector signals.

7. The apparatus of claim 6, wherein the correction module comprises logic to deactivate the counter based upon the differential count.

8. The apparatus of claim 6, wherein the counter is adapted to count cycles of a first of at least two signals for a time period and to count cycles of a second of the at least two signals for the time period, to determine the differential count.

9. The apparatus of claim 6, wherein the correction module comprises a signal generator to generate the delay signal based upon the differential count.

10. The apparatus of claim 6, wherein the correction module comprises circuitry to reset the counter after determining the differential count.

11. A system comprising:
    a clock generator to generate a first clock signal; and
    a duty cycle correction circuit to adjust a delay between rising and falling edges of the first clock signal based upon a delay signal, to generate an output clock signal; generate detector signals with frequencies based upon frequency responses of an oscillator to high and low states of the output clock signal and an inverted output clock signal; and generate the delay signal based upon a difference between the frequencies, wherein the duty cycle correction circuit comprises a detector to generate a first detector signal of the detector signals associated with the output clock signal and a second detector signal associated with the inverted output clock signal wherein the duty cycle correction circuit comprises a timing module to determine a time period.

12. The system of claim 11, further comprising synchronized logic coupled with the duty cycle correction circuit to execute operations during half-cycles of the output clock signal.

13. The system of claim 12, wherein the duty cycle correction circuit comprises a controller to adjust the delay of the edge in the output clock signal and maintain a substantially fixed delay for an opposing edge of the output clock signal to preserve a phase relationship associated with the first clock signal.

14. The system of claim 11, wherein the duty cycle correction circuit comprises a counter to determine a differential count related to the difference between the frequencies.

15. The system of claim 14, wherein the duty cycle correction circuit comprises logic to block transmission of the detector signals to deactivate the counter based upon the differential count.

16. The system of claim 11, wherein the timing module generates a reset signal after the time period to reset at least one counter having a count associated with the difference between the frequencies.

17. A method to adjust a duty cycle of an output clock signal, the method comprising:
    generating an output clock signal based upon an input clock signal, wherein a duty cycle of the output clock signal is based upon a delay signal;
    oscillating with frequencies dependent upon high and low states of the output clock signal to generate a first detector signal, wherein oscillating with frequencies dependent upon high and low states of the output clock signal comprises varying a current available to an oscillator based upon a voltage level of the output clock signal;
    oscillating with frequencies dependent upon high and low states of an inverted output clock signal to generate a second detector signal;
    comparing averages of the frequencies of the detector signals; and
    generating the delay signal based upon the comparison.

18. The method of claim 17, wherein comparing the averages of the frequencies of the detector signals comprises determining counts of cycles of the detectors signals for a time period and determining a difference between the counts.

19. The method of claim 17, further comprising resetting, at the expiration of a time period, a count associated with the comparing the averages of the frequencies of the detector signals.

20. The method of claim 17, wherein comparing the averages of the frequencies of the detector signals comprises counting up in response cycles of the first detector signal and counting down in response to cycles of the second detector signal.

* * * * *